(12) United States Patent
Nakanishi

(10) Patent No.: US 11,448,700 B2
(45) Date of Patent: Sep. 20, 2022

(54) OPERATION DATA COLLECTION SYSTEM, OPERATION DATA COLLECTION METHOD, AND INFORMATION STORAGE MEDIUM

(71) Applicant: Kabushiki Kaisha Yaskawa Denki, Kitakyushu (JP)

(72) Inventor: Mitsuaki Nakanishi, Kitakyushu (JP)

(73) Assignee: KABUSHIKI KAISHA YASKAWA DENKI, Fukuoka (JP)

( * ) Notice: Subject to any disclaimer, the term of this patent is extended or adjusted under 35 U.S.C. 154(b) by 416 days.

(21) Appl. No.: 16/569,763

(22) Filed: Sep. 13, 2019

(65) Prior Publication Data
US 2020/0088794 A1 Mar. 19, 2020

(30) Foreign Application Priority Data
Sep. 14, 2018 (JP) .............................. JP2018-172883

(51) Int. Cl.
H04L 12/24 (2006.01)
H04L 41/0803 (2022.01)
G01R 31/34 (2020.01)
G06F 11/36 (2006.01)
H04L 67/1097 (2022.01)
(Continued)

(52) U.S. Cl.
CPC .......... *G01R 31/34* (2013.01); *G06F 11/3636* (2013.01); *H04L 67/1097* (2013.01); *H04L 67/12* (2013.01); *H04L 69/40* (2013.01)

(58) Field of Classification Search
CPC . G01R 31/34; G06F 11/3636; G06F 11/3013; G06F 11/3048; G06F 11/3051; G06F 11/3072; G06F 17/40; G06F 11/3419; G06F 11/3476; H04L 67/1097; H04L 67/12; H04L 69/40; B25J 9/1674; G05B 19/042
USPC ....................................................... 324/765
See application file for complete search history.

(56) References Cited

U.S. PATENT DOCUMENTS

2004/0010325 A1 1/2004 Naitoh
2011/0173496 A1* 7/2011 Hosek ...................... G07C 3/00
714/26
(Continued)

FOREIGN PATENT DOCUMENTS

DE 102016217443 A1 9/2017
JP 2004094919 A 3/2004
(Continued)

OTHER PUBLICATIONS

Office Action dated Mar. 17, 2020, for corresponding JP Patent Application No. 2018-172883.
(Continued)

*Primary Examiner* — Yves Dalencourt
*Assistant Examiner* — Elizabeth Kassa
(74) *Attorney, Agent, or Firm* — HEA Law PLLC

(57) ABSTRACT

An operation data collection system comprises circuitry configured to: acquire, from an industrial device, configuration information on a connection destination device connected to the industrial device; execute a setting for collecting operation data on the connection destination device based on the configuration information; and collect the operation data from the industrial device based on the setting.

17 Claims, 12 Drawing Sheets

(51) Int. Cl.
   *H04L 67/12*   (2022.01)
   *H04L 69/40*   (2022.01)

(56) References Cited

U.S. PATENT DOCUMENTS

| | | | |
|---|---|---|---|
| 2014/0122631 A1* | 5/2014 | Tahara | H04L 61/2038 |
| | | | 709/208 |
| 2016/0238659 A1 | 8/2016 | Shiromoto et al. | |
| 2016/0239009 A1 | 8/2016 | Mizuno | |
| 2017/0329315 A1* | 11/2017 | Kanemaru | G05B 19/41815 |
| 2017/0331929 A1* | 11/2017 | Zielinski | H04L 69/18 |
| 2019/0302731 A1* | 10/2019 | Kettemer | G05B 23/0221 |
| 2019/0342396 A1 | 11/2019 | Tanabe et al. | |

FOREIGN PATENT DOCUMENTS

| | | | |
|---|---|---|---|
| JP | 2011197785 A | 10/2011 | |
| JP | 2017207830 A | 11/2017 | |
| JP | 6333504 B1 | 5/2018 | |
| WO | 2015/068210 A1 | 5/2015 | |
| WO | 2015068214 A1 | 5/2015 | |
| WO | 2017149145 A1 | 9/2017 | |

OTHER PUBLICATIONS

Search Report dated Jan. 27, 2020, for corresponding EP Patent Application No. 19196676.1.

* cited by examiner

FIG.3

| ROBOT CONTROLLER | MECHANISM | DEVICE | OPERATION DATA | DATE AND TIME |
|---|---|---|---|---|
| 21 | 22A | 23A | TORQUE SIGNAL DATA | 2018/9/4 8:00–2018/9/4 15:00 |
| | | | TORQUE SIGNAL DATA | 2018/9/5 8:00–2018/9/5 15:00 |
| | | | TORQUE SIGNAL DATA | 2018/9/6 8:00–2018/9/6 15:00 |
| | | | ... | ... |
| 21 | 22A | 23B | TORQUE SIGNAL DATA | 2018/9/4 8:00–2018/9/4 15:00 |
| | | | TORQUE SIGNAL DATA | 2018/9/5 8:00–2018/9/5 15:00 |
| | | | TORQUE SIGNAL DATA | 2018/9/6 8:00–2018/9/6 15:00 |
| ... | ... | ... | ... | ... |

| CONTROLLER | CONFIGURATION INFORMATION DB2 | |
|---|---|---|
| | MECHANISM | DEVICE |
| 21 | 22A | 23A |
| | | 23B |
| | | 23C |
| | | 23D |
| | | 23E |
| | | 23F |
| | 22B | 23G |
| | 22C | 23H |
| | | 23I |

| SETTING NAME | SAMPLING TIME | COLLECTION PERIOD | CLASSIFICATION | SIGNAL | COLUMN | GROUP | AXIS | UNIT | MAGNIFICATION |
|---|---|---|---|---|---|---|---|---|---|
| APPLICATION A | 8.0 | 8:00–15:00 | REAL TIME | TORQUE | Trq | R1 | S | % | 1.0 |
| | | | INPUT/OUTPUT SIGNAL | 10020 | WORKPIECE HAS BEEN SET | – | – | – | 1.0 |
| | | | SERVO | EXTERNAL FORCE VALUE | D2real | R1 | S | Nm | 1.0 |
| | | | ... | ... | ... | ... | ... | ... | ... |
| APPLICATION B | 16.0 | 10:00–14:00 | REAL TIME | TORQUE | Trq | R1 | S | % | 1.0 |
| | | | INPUT/OUTPUT SIGNAL | 10020 | WORKPIECE HAS BEEN SET | – | – | – | 1.0 |
| | | | SERVO | EXTERNAL FORCE VALUE | D2real | R1 | S | Nm | 1.0 |
| | | | ... | ... | ... | ... | ... | ... | ... |
| ... | | | | | | | | | |

FIG.9

PLEASE ENTER COLLECTION CONDITION — G

SETTING NAME: APPLICATION A — F1

SAMPLING TIME (ms): 8.0 ▼ — F2

COLLECTION PERIOD: 6:00 ~ 17:00 — F3

| CLASSIFICATION | SIGNAL SELECTION | COLUMN NAME | GROUP SELECTION | AXIS SELECTION | UNIT | MAGNIFICATION |
|---|---|---|---|---|---|---|
| CH1 ☐ REAL TIME ▼ | TORQUE ▼ | Trq | R1 ▼ | S ▼ | % | 1.0 |
| CH2 ☐ INPUT/OUTPUT SIGNAL ▼ | 10020 | WORKPIECE HAS BEEN SET | | | | |

F4, F5, F6, F7, F8, F9, F10

OPERATION DATA COLLECTION SYSTEM, OPERATION DATA COLLECTION METHOD, AND INFORMATION STORAGE MEDIUM

CROSS-REFERENCE TO RELATED APPLICATION

The present disclosure contains subject matter related to that disclosed in Japanese Patent Application JP2018-172883 filed in the Japan Patent Office on Sep. 14, 2018 the entire contents of which are hereby incorporated by reference.

BACKGROUND OF THE INVENTION

1. Field of the Invention

The embodiments disclosed herein relate to an operation data collection system, an operation data collection method, and an information storage medium.

2. Description of the Related Art

In WO 2015/068210 A1, there is described a system, in which connection destination devices such as a motor control device and a motor are connected to an industrial device, for example, a controller, and which is configured to upload trace data on the connection destination devices to a cloud server, and request an analyst to analyze the trace data.

SUMMARY OF THE INVENTION

According to one embodiment of the present invention, there is provided an operation data collection system, including: a configuration information acquisition module configured to acquire, from an industrial device, configuration information on a connection destination device connected to the industrial device; a setter configured to execute a setting for collecting operation data on the connection destination device based on the configuration information; and a collector configured to collect the operation data from the industrial device based on the setting.

BRIEF DESCRIPTION OF THE DRAWINGS

FIG. 3 is a table for showing a data storage example of an operation database.

FIG. 4 is a table for showing a data storage example of a configuration information database.

FIG. 5 is a table for showing a data storage example of a collection condition database.

FIG. 9 is a diagram for illustrating an example of a setting screen.

DESCRIPTION OF THE EMBODIMENTS

[1. Overall Configuration of Operation Data Collection System]

From a view point of the inventor of the present invention, when operation data on a connection destination device connected to an industrial device is collected and analyzed, and a configuration of the connection destination device is not considered, the same pieces of operation data are redundantly collected, and unrequired operation data is collected, resulting in a possibility of inefficient collection of the operation data. Thus, the inventor of the present invention intensively conducted research and development for collecting data in accordance with the configuration of the connection destination device connected to the industrial device, and arrived at a novel and original operation data collection system and the like. A detailed description is now given of the operation data collection system and the like according to an embodiment of the present invention.

Figure 1:
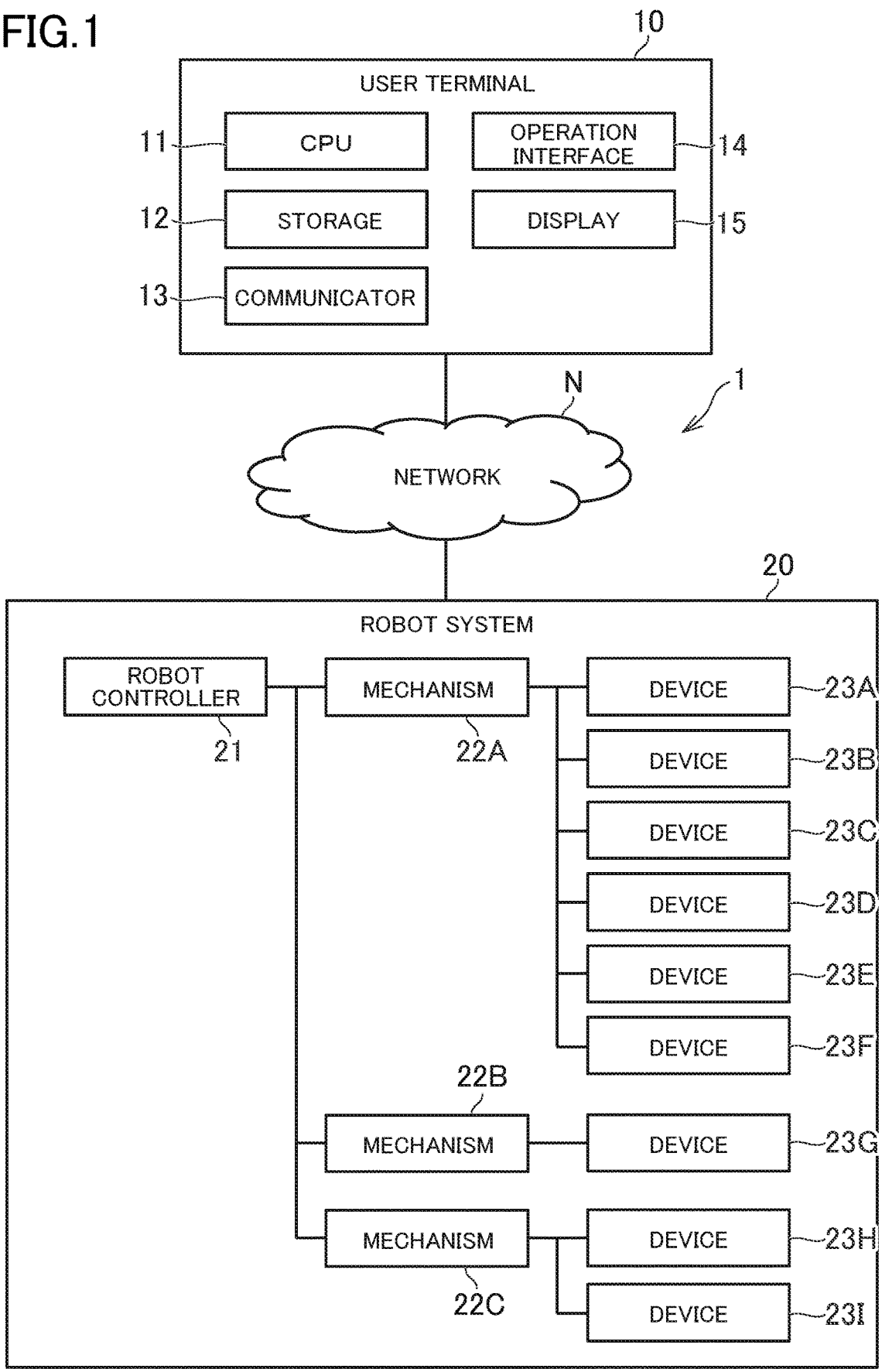
FIG. 1 is a diagram for illustrating an overall configuration of an operation data collection system according to an embodiment of the present invention.

FIG. 1 is a diagram for illustrating an overall configuration of the operation data collection system according to the embodiment. As illustrated in FIG. 1, the operation data collection system 1 includes a user terminal 10 and a robot system 20. Each of the user terminal 10 and the robot system 20 is connected to a network N such as the Internet or a local area network. In FIG. 1, one user terminal 10 and one robot system 20 are illustrated, but there may be a plurality of user terminals 10 and robot systems 20.

The user terminal 10 is a computer configured to collect the operation data. For example, the user terminal 10 is a personal computer, a cellular phone (including a smartphone), or a mobile terminal (including a tablet terminal). The user terminal 10 includes a CPU 11, a storage 12, a communicator 13, an operation interface 14, and a display 15.

The CPU 11 includes at least one processor. The storage 12 includes a RAM and a hard disk, and is configured to store various programs and data. The CPU 11 is configured to execute various types of processing based on those programs and data. The communicator 13 includes a network card and a communication interface, for example various types of communication connectors, and is configured to communicate with other devices. The operation interface 14 is an input device such as a mouse and a keyboard. The display 15 is a liquid crystal display, an organic EL display, or the like, and is configured to display various types of screens in accordance with an instruction from the CPU 11.

The programs and data described as being stored in the storage 12 may be supplied to the user terminal 10 through the network N. Moreover, the hardware configuration of the user terminal 10 is not limited to the above-mentioned example, and various types of hardware can be applied. For example, the user terminal 10 may include a reader (for example, an optical disc drive and a memory card slot) configured to read a computer-readable information storage medium and an input/output device (for example, a USE terminal) configured to directly connect to an external device. In this case, programs and data stored in the information storage medium may be supplied to the user terminal 10 through the reader or the input/output device.

The robot system 20 includes a robot controller 21, mechanisms 22A to 22C, and devices 23A to 23I. In the following, when the mechanisms 22A to 22C are not particularly required to be distinguished from one another, the mechanisms 22A to 22C are simply described as a mechanism 22. Moreover, when the devices 23A to 23I are not particularly required to be distinguished from one another, the devices 23A to 23I are simply described as a device 23. Further, for the sake of a simple description, the number of robot controllers 21 is one, but there may be a plurality of robot controllers 21. Moreover, there may be any number of mechanisms 22 and devices 23, and the numbers are not limited to the configuration of FIG. 1.

The robot controller 21 is a computer configured to control a robot. The robot controller 21 may be a dedicated device specialized in a specific robot, but is a general computer in this embodiment. The robot controller 21 has hardware such as a CPU, a RAM, a hard disk, and a communication interface, and is configured to transmit an operation instruction to the robot. The robot controller 21 may control a plurality of robots.

The mechanism 22 and the device 23 are components of the robot. The robot is an industrial robot, and is, for example, a general-purpose articulated robot. For example, various types of robots such as a vertical articulated robot, a horizontal articulated robot, and a gantry robot can be applied. There may be any number of arms of the robot. There may be only one arm or a plurality of arms.

Moreover, for example, robots for various applications can be applied to the robot, and the robot may be a spot welding robot, an arc welding robot, a handling robot, or a painting robot. For example, the mechanism 22A is a spot welding robot of a six-axis vertical articulated type, and includes the devices 23A to 23F as axes. Moreover, for example, the mechanism 22B is a welding gun, and includes the device 23G as an axis. Moreover, for example, the mechanism 22C is a station, and includes the devices 23H and 23I as axes. Each of the devices 23 includes sensors configured to measure own operations, and may include any sensor such as a torque sensor, a motor encoder, a temperature sensor, or a pressure-sensitive sensor.

The robot controller 21 is an example of the industrial device. The robot (the mechanism 22 and the device 23) is an example of the connection destination device. Therefore, in this embodiment, a part described as the robot controller 21 can be replaced by the industrial device, and a part described as the robot, the mechanism 22, or the device 23 can be replaced by the connection destination device.

In the operation data collection system 1, any type of industrial device can be applied. For example, a motor controller or an inverter may correspond to the industrial device. The connection destination device is only required to be a device corresponding to the type of the industrial device. For example, when the motor controller corresponds to the industrial device, the connection destination device may be a control device or a motor that receives an instruction from the motor controller. Moreover, for example, when a plurality of inverters cooperate with one another as a master inverter and slave inverters, the master inverter corresponds to the industrial device, and the slave inverters correspond to the connection destination devices.

Moreover, for example, a machine tool may correspond to the industrial device. The machine tool is a machine configured to apply machining, for example, cutting and grinding to metal, wood, and the like, and includes a lathe, a drilling machine, a grinder, and an electric discharge machine. When a machine tool corresponds to the industrial device, the connection destination device may be a motor, an input/output device, or a sensor (for example, a temperature sensor or a force sensor) connected to the machine tool. Moreover, for example, a programmable logic controller (PLC) may correspond to the industrial device. The PLC is a device configured to control an external device in accordance with a procedure set in advance, and is used for, for example, automatic control in a factory, or is used for control for a device such as an elevator or an automatic door. When the PLC corresponds to the industrial device, the connection destination device may be a machine, a facility, or a robot controller controlled by the PLC (under the control of the PLC).

In the operation data collection system 1 according to this embodiment, configuration information on the robot connected to the robot controller 21 is stored in the robot controller 21. The user terminal 10 is configured to acquire the configuration information from the robot controller 21 to set a collection condition for the operation data on the robot, to thereby achieve efficient data collection corresponding to the configuration of the robot. A detailed description is now given of the operation data collection system 1.

[2. Functions to be Implemented by Operation Data Collection System]

Figure 2:
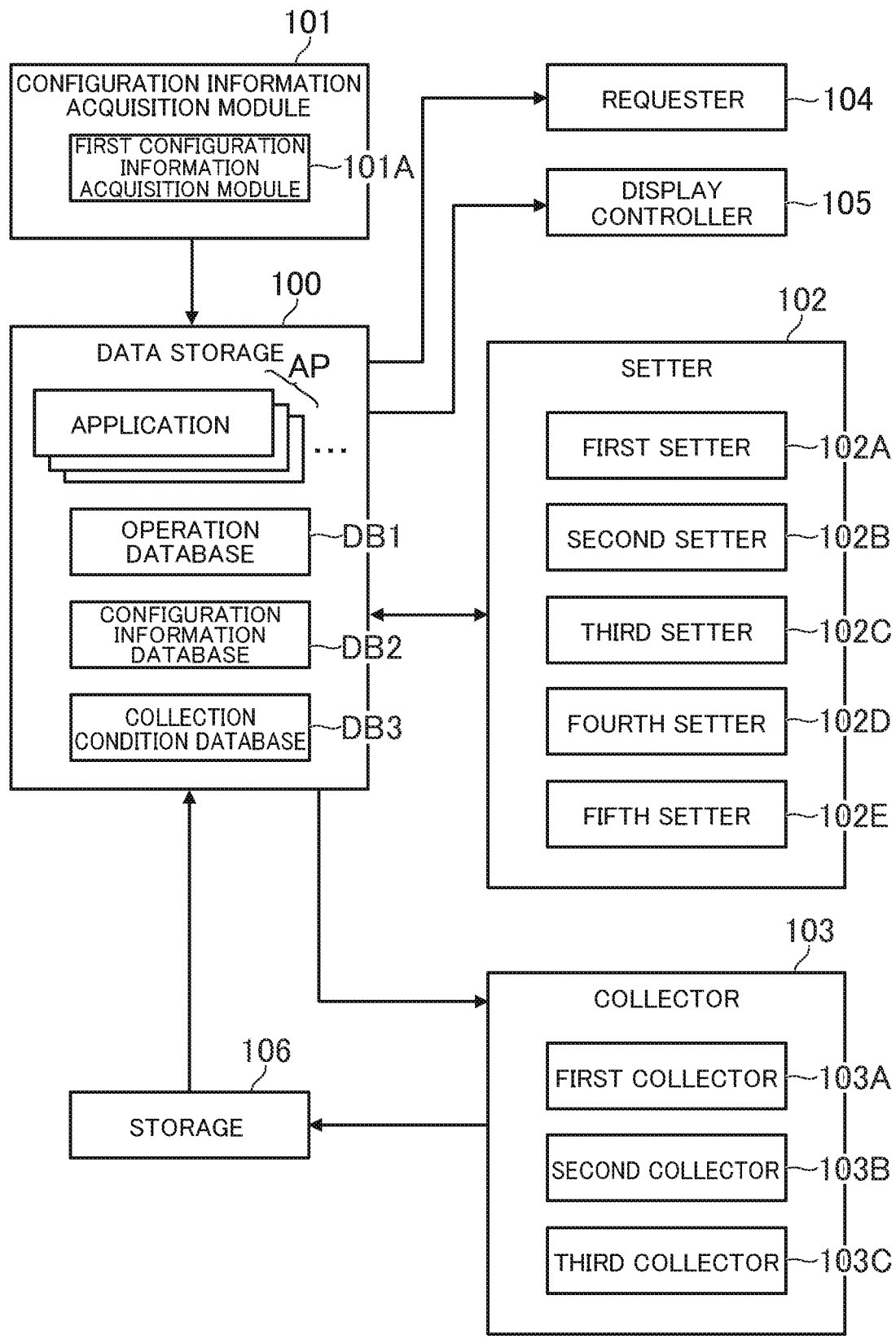
FIG. 2 is a functional block diagram for illustrating functions to be implemented in the operation data collection system.

FIG. 2 is a functional block diagram for illustrating functions to be implemented in the operation data collection system 1. As illustrated in FIG. 2, a data storage 100, a configuration information acquisition module 101, a setter 102, a collector 103, a requester 104, a display controller 105, and a storage 106 are implemented in the operation data collection system 1. In this embodiment, a description is given of a case in which those respective functions are implemented in the user terminal 10.

[Data Storage]

The data storage 100 is mainly implemented by the storage 12. The data storage 100 is configured to store data required to collect the operation data. For example, the data storage 100 stores a plurality of applications AP for collecting the operation data. The data storage 100 may store any number of applications AP. For example, the data storage 100 may store only one application AP.

The application AP is a program for collecting and analyzing the operation data. The operation data is only required to be data indicating the operation of the robot. Various types of information such as a torque signal, temperature information, a speed feedback value, an external force value, or a feedback pulse signal may be indicated by the operation data. The application AP is only required to correspond to the type of the robot or an object of the analysis, and may be, for example, a standard application for operating the operation data collection system 1 or an application for executing specific operation analysis. Those applications may be produced by a manufacturer, or a user may produce those applications, and install the applications in the user terminal 10 as an add-on program.

The standard application may be web server software for operating the operation data collection system 1 or an executable application written in a program language, for example, the C language. The program language is not limited to the C language, and any language is applicable. The application for executing the specific operation analysis is an application produced so as to analyze a specific operation of the robot. It is possible to apply various applications such as an application configured to collect the operation data on the robot, and store the operation data in an operation database DB1, an application configured to predict a failure in a speed reducer of the robot, an application configured to detect sputter scattered when the robot executes gas welding or arc welding, and an application configured to monitor spot welding by the robot.

Moreover, for example, the data storage 100 stores the operation database DB1, a configuration information database DB2, and a collection condition database DB3.

FIG. 3 is a table for showing a data storage example of the operation database DB1. As shown in FIG. 3, the operation database DB1 is a database for storing the operation data. For example, identification information on a device for which the operation data is measured, actual data of the operation data, and collected date and time of the operation data are stored in the operation database DB1.

Respective names of the robot controller 21, the mechanism 22, and the device 23 are stored as the identification information on the devices for which the operation data is measured in the example of FIG. 3. In this embodiment, the operation data, for example, a torque signal is measured by the device 23, and thus the respective names of the device 23 for which the operation data is measured, the mechanism 22 configured to control the device 23, and the robot controller 21 configured to control the mechanism 22 are stored. The operation data may be in any data format, and may be in a table format, for example, a CSV file format or in a text format. The collection date and time of the operation data is a date and time at which the operation data is measured.

The data stored in the operation database DB1 is not limited to the example of FIG. 3, and other information relating to the operation data may be stored. For example, information such as types of the operation data, identification information on applications AP that use the operation data, and collection conditions used when the operation data is collected may be stored in the operation database DB1.

FIG. 4 is a table for showing a data storage example of the configuration information database DB2. As shown in FIG. 4, the configuration information database DB2 is a database for storing the configuration information acquired from the robot controller 21. For example, a controller ID for identifying the robot controller 21 and configuration information acquired from this robot controller 21 are stored in the configuration database DB2.

In this embodiment, the number of robot controllers 21 is one, and one piece of configuration information is stored in FIG. 4. However, when there are a plurality of robot controllers 21, the same number of pieces of configuration information as that of robot controllers 21 are stored. A configuration of the robot controlled by the robot controller 21 is indicated in the configuration information. In this embodiment, the robot includes the mechanism 22 and the device 23, and thus the mechanism 22 controlled by the robot controller 21 and the device 23 included in the mechanism 22 are indicated in the configuration information.

Moreover, a plurality of robots are hierarchically connected to the robot controller 21 in this embodiment, and thus a hierarchy of the plurality of robots is indicated in the configuration information. The hierarchy may be referred to as a vertical relationship or a parent-child relationship. An upper layer in the hierarchy is a controlling side. A lower layer in the hierarchy is a controlled side. In this embodiment, the robot controller 21 is the upper most layer. The mechanism 22 is a middle layer. The device 23 is the lowest layer. For example, there are the mechanisms 22A to 22C under the robot controller 21. Moreover, for example, there are the devices 23A to 23F under the mechanism 22A. There is the device 23G under the mechanism 22B. There are the devices 23H and 23I under the mechanism 22C. There may be a layer higher than that of the robot controller 21. For example, there may be an upper layer such as a plant, a line, or a cell.

Moreover, in this embodiment, a plurality of connection destination devices including the mechanism 22 and the device 23 controlled by the mechanism 22 are connected to the robot controller 21. Therefore, a master/slave relationship of the plurality of connection destination devices is indicated in the configuration information. The mechanism 22 is an example of the master device. The device 23 is an example of the slave device. The master device is a device that controls the slave device. The slave device is a device controlled by the master device. For example, the mechanism 22A controls the devices 23A and 23F, and thus the mechanism 22A is a master device, and the devices 23A to 23F are slave devices. Moreover, for example, the mechanism 22B controls the device 23G, and thus the mechanism 22B is a master device, and the device 23G is a slave device. Further, for example, the mechanism 22C controls the devices 23H and 23I, and thus the mechanism 22C is a master device, and the devices 23H and 23I are slave devices.

FIG. 5 is a table for showing a data storage example of the collection condition database DB3. As shown in FIG. 5, the collection condition database DB3 is a database for storing the collection conditions for the operation data. For example, the collection condition is stored for each name of the collection condition in the collection condition database DB3. In this embodiment, the collection condition is set for each application AP, and thus the set name of the collection condition is the name of the application AP.

Any condition can be set as the collection condition, and the collection condition may be, for example, a sampling time, a collection period, a classification, a type of a signal, a column name, a group, a subject axis, a unit, and a magnification. The sampling time is a time interval of measuring the operation data, and the operation data is measured at each sampling time. The collection period is a time period in which the operation data is measured. The classification is a classification of the operation data, and for example, such classifications as real time, a servo, an input or output signal, a resister, and the like exist.

The type of a signal is a type of a signal acquired as the operation data, and includes, for example, a torque signal, a temperature signal, a speed feedback signal, an external force value, a feedback pulse signal, or any signal number input by the user. The column name is a name assigned to a column of the operation data, and a name, for example, "Trq" indicating the torque signal, may automatically be set, or the user may be able to enter any name. The group is a group of robots for which the operation data is collected. The subject axis is an axis for which the operation data is measured. The unit is a unit of information stored in the operation data. The magnification is a scale for information stored in the operation data.

The data stored in the data storage 100 is not limited to the above-mentioned example. For example, the data storage 100 may store data on an application list indicating a list of the applications AP. The application list data is updated each time the application AP is installed as an add-on program.

[Configuration Information Acquisition Module]

The configuration information acquisition module 101 is implemented mainly by the controller 11. The configuration information acquisition module 101 acquires from a robot controller 21 the configuration information on the robots (the mechanism 22 and the device 23) connected to the robot controller 21. The data configuration example of the configuration information is as described with reference to FIG. 4. The configuration information is stored in a storage of the robot controller 21. The configuration information may be dynamically generated by the robot controller 21 based on a predetermined algorithm, or the user may connect a computer, for example, the user terminal 10 to the robot controller 21, to thereby manually set the configuration information.

For example, the configuration information acquisition module 101 transmits an acquisition request for the configuration information to the robot controller 21. The acquisition request for the configuration information is only required to be transmitted at any timing, and for example, may be transmitted when the user inputs the IP address of the robot controller 21, or when a file storing the IP address of the robot controller 21 is read. In other cases, for example, the acquisition request for the configuration information may be transmitted when a list of robot controllers 21 is displayed on the display 15, and the robot controller 21 is selected from the list. The acquisition request for the configuration information may not be made, and the robot controller 21 may voluntarily transmit the configuration information to the user terminal 10.

In this embodiment, a description is given of a case in which there is one robot controller 21, but, in a case in which there are a plurality of robot controllers 21, the configuration information acquisition module 101 includes a first configuration information acquisition module 101A. The first configuration information acquisition module 101A is configured to acquire the configuration information from each of the plurality of robot controllers 21. Each of the robot controllers 21 stores configuration information indicating the configurations of the robots subject to the own control, and thus the first configuration acquisition module transmits the acquisition request for the configuration information to each of the robot controllers 21, and receives the configuration information from each of the robot controllers 21. Further, in the case in which there area plurality of robot controllers 21, each of the robot controllers 21 may voluntarily transmit the configuration information to the user terminal 10.

[Setter]

The setter 102 is implemented mainly by the controller 11. The setter 102 is configured to execute a setting for collecting the operation data on the robot (the mechanism 22 and the device 23) based on the configuration information. The setting may be a setting for a collection condition for the operation data or a setting for a data structure of the operation database DB1. In this embodiment, the setter 102 includes a first setter 102A, a second setter 102B, a third setter 102C, a fourth setter 102D, and a fifth setter 102E. A setting described below is made. The setting described below is a specific example of processing by the setter 102, and the entire setting described below may not always be made. Only a part of the setting described below may be made.

The first setter 102A sets the collection condition for the operation data based on the configuration information. That is, the first setter 102A sets which type of operation data is collected from which robot in accordance with which measurement schedule based on the configuration information. For example, the first setter 102A sets the collection condition so as to collect the operation data from the robot indicated by the configuration information. In this embodiment, the collection conditions include items such as the sampling time, the collection period, the classification, the type of a signal, the column name, the group, the subject axis, the unit, and the magnification, and the first setter 102A sets those collection conditions.

For example, the first setter 102A sets the sampling time of the operation data. Any interval can be set as the sampling time. For example, the interval may be some milliseconds, some seconds, or some minutes. As the sampling time, the user may input any numerical value, or the user may select a numerical value from a plurality of numerical values. When the user selects the sampling time from a plurality of numerical values, numerical values each of which is an n-multiple (n is an integer equal to or larger than 2) of the minimum value such as 8 milliseconds, 16 milliseconds, 32 milliseconds, or 64 millisecond may be provided for the selection, or such numerical values may not be provided. In other cases, for example, when a control period for the robot indicated by the configuration information is defined in advance, the sampling time may be set based on the control period. In other cases, for example, the sampling time that can be set may be limited by a configuration of the robot indicated by the configuration information.

Moreover, for example, the first setter 102A sets the collection period of the operation data. Any time period of the day can be specified as the collection period. The first setter 102A sets the collection period of the operation data based on the configuration information. A user may specify any time period as the collection period. When a time period in which the robot indicated by the configuration information operates is determined in advance, the collection period may be specified within this time period. In other cases, for example, the collection period that can be set may be limited by the configuration of the robot indicated by the configuration information. In this embodiment, the collection condition can be set for each of the applications AP, and thus the collection period of the operation data is set for each of the applications AP.

Figure 6:
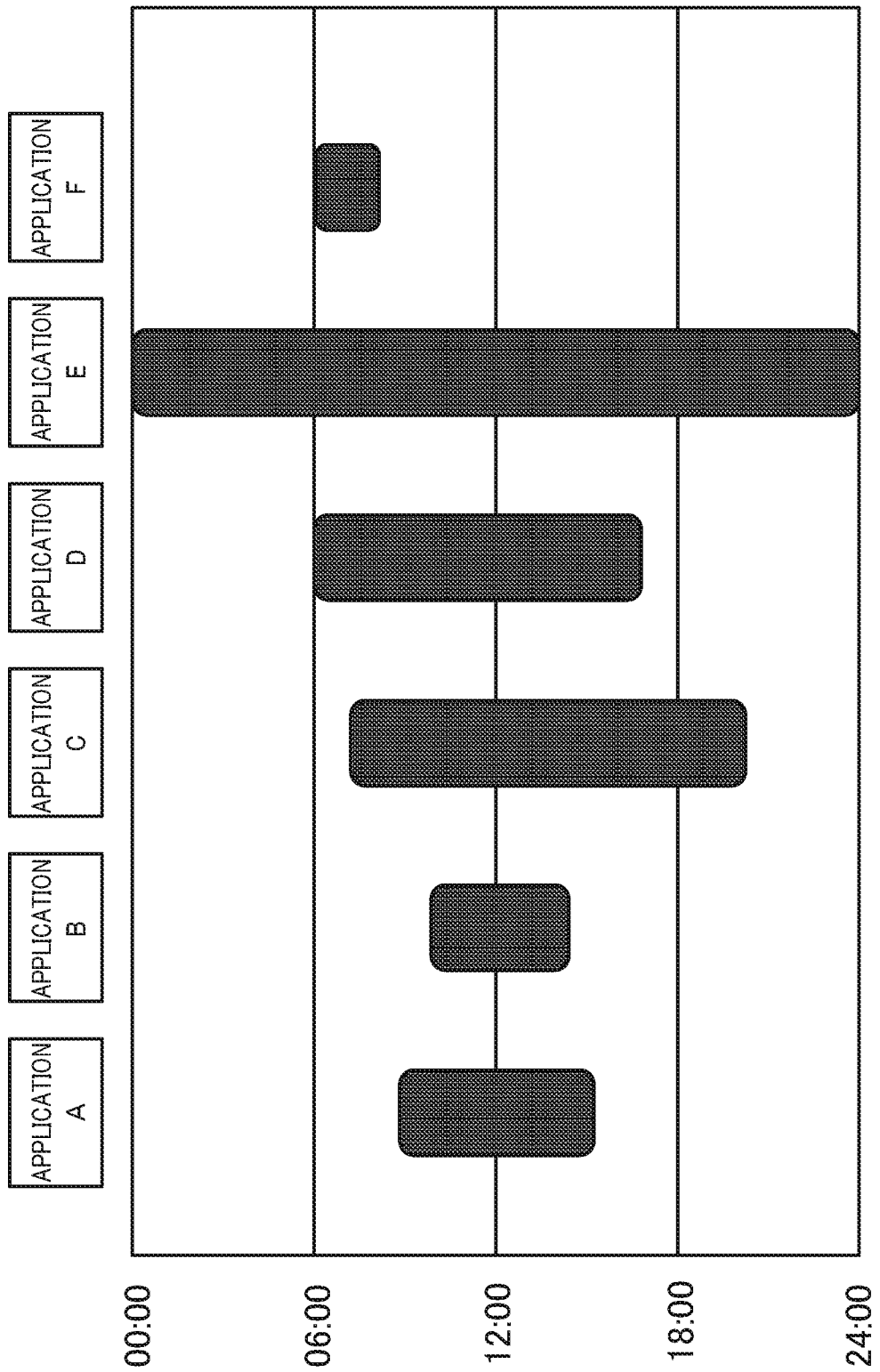
FIG. 6 is a diagram for illustrating how a collection period for operation data is set for each application.

FIG. 6 is a diagram for illustrating how the collection period of the operation data is set for each application AP. In the example illustrated in FIG. 6, there are six applications AP of "application A" to "application F". The collection period for each of the applications is indicated by a shaded strip. As illustrated in FIG. 6, for each of the applications AP, a collection period different from that of other applications AP can be set.

Moreover, for example, the first setter 102A sets a type of operation data to be collected and a robot for which the operation data is collected. For example, the type of operation data and the robot for which the operation data is collected are identified by the classification, the type of a signal, the group, and the subject axis contained in the collection condition. The first setter 102A sets the values of those items of the collection condition. The configuration of the robot is indicated in the configuration information, and types of data that can be collected can be identified from the type of the robot. Thus, the first setter 102A may set the type of data that can be collected in the robot indicated by the configuration information as the type of operation data to be collected. For example, when a robot for spot welding is contained in the configuration indicated by the configuration information, the first setter 102A may automatically set the type such as the torque signal and the speed feedback value as the types of operation data to be collected. Moreover, the configurations of the robots are indicated in the configuration information, and thus the first setter 102A may set the robot for which the operation data is collected from the robots indicated by the configuration information. Moreover, in this embodiment, the collection condition includes the items such as the unit and the magnification, and thus the first setter 102A sets those items included in the collection condition.

Only one collection condition may be specified, but the collection condition is specified for each of the applications AP in this embodiment, and the second setter 102B sets, when a plurality of collection conditions are set, an integrated collection condition obtained by integrating the plurality of collection conditions. The integrated collection condition is a condition obtained by excluding redundant conditions from the plurality of collection conditions, and is a condition in a sense of the least common multiple of the plurality of collection conditions. The integrated collection condition is different from the collection condition in such a point that the plurality of collection conditions are integrated, and the set items of the integrated collection condition are the same as those of the collection condition. That is, in this embodiment, the integrated collection condition includes items such as the sampling time, the collection period, the classification, the type of a signal, the column name, the group, the subject axis, the unit, and the magnification.

For example, when a robot for which the operation data is collected is redundant among the plurality of collection conditions, the second setter 102B sets the integrated collection condition so that the same operation data is not redundantly collected from this robot. Specifically, when the device 23A is a collection subject in a collection condition A, and the device 23A is also a collection subject in another collection condition B, the second setter 102B sets an integrated collection condition so as not to redundantly collect the same operation data from the device 23A. That is, the second setter 102B sets the integrated collection condition so that the same operation data is not redundantly collected from the device 23A, and the same operation data is collected only once from the device 23A.

In this embodiment, the collection condition includes at least one of the type of operation data to be collected and the measurement schedule of the operation data, and thus the third setter 102C sets the integrated collection condition when at least one of the type or the schedule is redundant. The measurement schedule is a timing at which or a time period in which the operation data is measured, and thus may mean the sampling time or the collection period.

For example, when the type of operation data to be collected is redundant among the plurality of collection conditions, the third setter 102C sets the integrated collection condition so that the same type of operation data is not redundantly collected. Specifically, when the torque signal of the device 23A is a collection subject in a collection condition A, and the same torque signal of the device 23A is also a collection subject in another collection condition B, the third setter 102C sets an integrated collection condition so as not to redundantly collect the same torque signal from the device 23A. That is, the third setter 102C sets the integrated collection condition so that the same torque signal is not redundantly collected from the device 23A, and the same torque signal is collected only once from the device 23A.

Moreover, for example, when sampling timing of the operation data is redundant in the plurality of collection conditions, the third setter 102C sets an integrated collection condition so that a plurality of pieces operation data are not collected at the sampling timing. Specifically, when the sampling time of the operation data on the device 23A is 8 milliseconds under a certain collection condition A and the sampling time of the operation data on the device 23A is 32 milliseconds under another collection condition B, as long as the operation data sampled at 8 milliseconds exists, the operation data at the sampling time of 32 milliseconds can be acquired only by decimating this operation data. Therefore, when a certain sampling time is an integer multiple of another sampling time, the third setter 102C sets an integrated collection condition obtained by integrating the sampling times to the minimum value of the sampling time.

Moreover, for example, when a sampling period of the operation data is redundant in the plurality of collection conditions, the third setter 102C sets an integrated collection condition so that a plurality of pieces of operation data are not collected in the same time period. Specifically, when the collection period of the operation data of the device 23A is from 8 o'clock in the morning to 4 o'clock in the afternoon in one collection condition A, and the collection period of the operation data of the device 23A is from 10 o'clock in the morning to 2 o'clock in the afternoon in another collection condition B, as long as the operation data from 8 o'clock in the morning to 4 o'clock in the afternoon exists, the operation data from 10 o'clock in the morning to 2 o'clock in the afternoon can be acquired. Therefore, when a certain collection period entirely contains another collection period, the third setter 10C sets the integrated collection condition obtained by integrating the collection periods to the longer collection period.

In other cases, for example, when the collection period of the operation data of the device 23A is from 9 o'clock in the morning to 1 o'clock in the afternoon in one collection condition C, and the collection period of the operation data of the device 23A is from 11 o'clock in the morning to 4 o'clock in the afternoon in another collection condition D, as long as the operation data from the earliest time point of 9 o'clock in the morning to the latest time point of 4 o'clock in the afternoon exists, the operation data in both of the time periods can be acquired. Therefore, when a certain collection period contains a part of another collection period, the third setter 102C sets a collection period obtained by coupling those collection periods to each other as the integrated collection condition.

The fourth setter 102D sets the data structure of the operation database DB1 configured to store the operation data based on the configuration information. For example, the fourth setter 102D sets a data structure of the operation database DB1 based on the configuration information. The configuration of the robot is indicated in the configuration information, and the fourth setter 102D sets the data structure of the operation database DB1 so that the name of the robot can be stored in association with operation data. With the data storage example of FIG. 3, the operation data is stored for each combination of the robot controller 21, the mechanism 22, and the device 23. Thus, the fourth setter 102D identifies a combination indicated by the configuration information, and sets the data structure of the operation database DB1 so that the operation data can be stored for each combination.

In this embodiment, a description is given of the case in which there is one robot controller 21, but, in a case in which there are a plurality of robot controllers 21, the fifth setter 102E executes the setting for each of the robot controllers 21. For example, the fifth setter 102E sets the collection condition, or sets the data structure of the operation database DB1 for each of the robot controllers 21. A setting method for each of the robot controllers 21 is as described above. For example, when a plurality of collection conditions are specified for each of the robot controllers 21, the integrated collection condition is set for each of the robot controllers 21.

Figure 7:
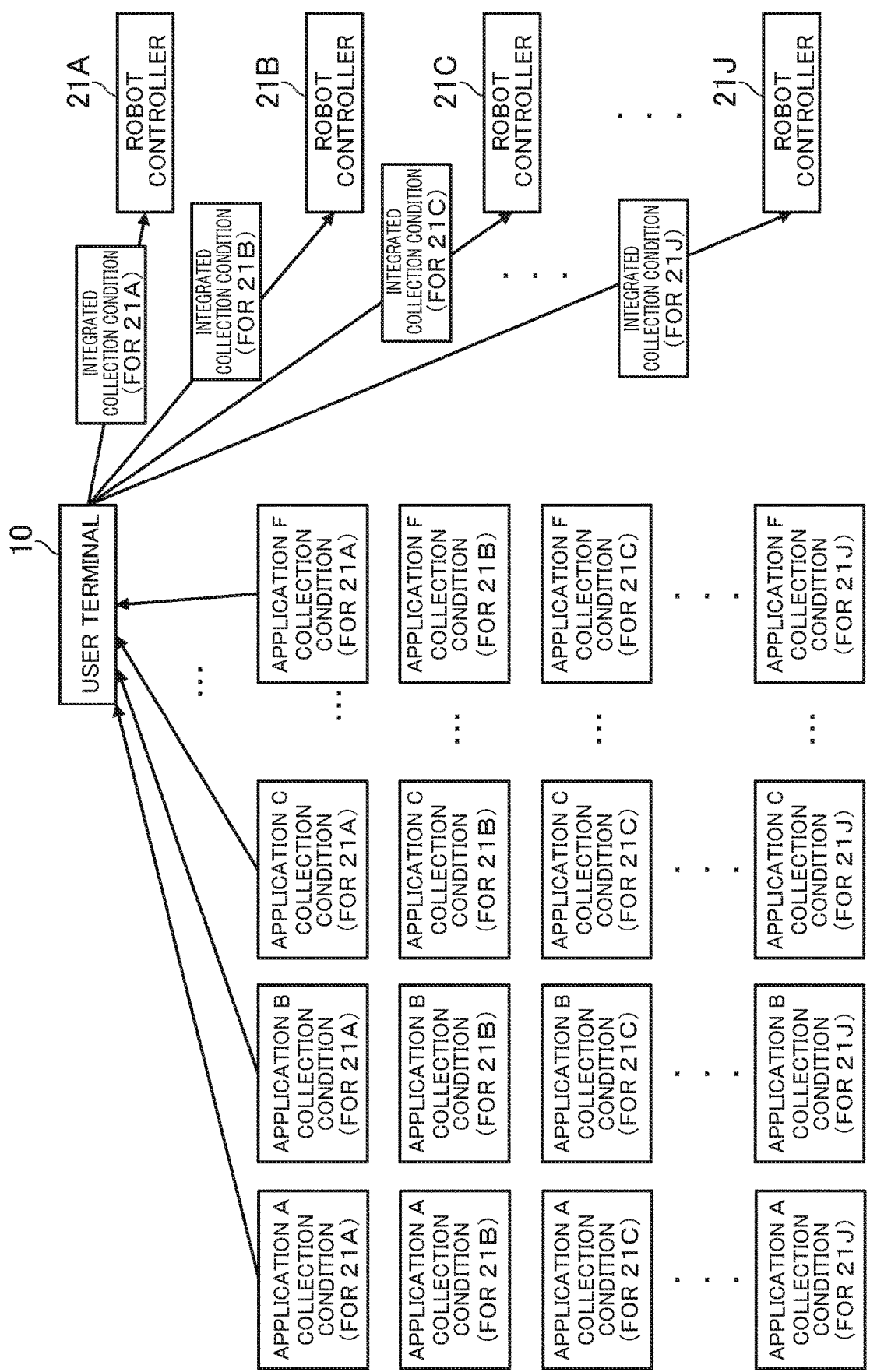
FIG. 7 is a diagram for illustrating how an integrated collection condition is set for each robot controller.

FIG. 7 is a diagram for illustrating how an integrated collection condition is set for each robot controller 21. In the example of FIG. 7, there are ten robot controllers 21A to 21J, and there are six applications AP of "application A" to "application F". The collection conditions of the respective robot controllers 21 are set for each of the applications AP. In this case, the fifth setter 10E integrates the collection conditions for "application A" to "application F" set for the robot controller 21A, to thereby set the integrated collection condition for the robot controller 21A. Similarly, the fifth setter 10E integrates the collection conditions for "application A" to "application F" set for the robot controller 21B, to thereby set the integrated collection condition for the robot controller 21B. As illustrated in FIG. 7, the integrated collection conditions are similarly set also for the other robot controllers 21C to 21J.

[Collector]

The collector 103 is implemented mainly by the controller 11. The collector 103 collects the operation data from the robot controller 21 based on the setting. The robot controller 21 measures the operation data on the robot based on the setting in the setter 102, and the collector 103 collects the measured operation data. The collector 103 may collect the operation data from the robot controller 21 appropriately, or, when a certain time point arrives, may collect all the pieces of operation data that have been measured until that time point. In this embodiment, the collector 103 includes a first collector 103A, a second collector 103B, and a third collector 103C.

In this embodiment, the first setter 102A sets the collection condition, and the first collector 103A collects the operation data from the robot controller 21 based on this collection condition. The robot controller 21 measures the operation data based on the collection condition set by the first setter 102A, and transmits the measured operation data to the user terminal 10, and thus the first collector 103A collects the measured operation data. For example, the robot controller 21 identifies the type of operation data and a robot for which the operation data is collected, which are contained in the collection condition, and measures the operation data of this type on this robot. The robot controller 21 collects the operation data based on the sampling time contained in the collection condition. Moreover, the robot controller 21 changes values of the torque signal and the like measured by the robot, and stores the changed values in the operation data based on the magnification contained in the collection condition.

Moreover, in this embodiment, the second setter 102B sets the integrated collection condition, and the second collector 103B collects the operation data from the robot controller 21 based on the integrated collection condition. The robot controller 21 measures the operation data based on the integrated collection condition set by the second setter 102B, and transmits the measured operation data to the user terminal 10, and thus the second collector 103B collects the measured operation data. The robot controller 21 refers to the integrated collection condition when the operation data is measured. The flow of measurement of the operation data on the robot by the robot controller 21 is as described above.

Moreover, in this embodiment, a description is given of the case in which the there is one robot controller 21. When there are a plurality of robot controllers 21, the setting is executed by the fifth setter 102E for each of the robot controllers 21, and the third collector 103C collects operation data from the robot controller 21 based on the setting for each robot controller 21. The robot controller 21 measures the operation data based on the setting dedicated to the robot controller 21 itself and set by the fifth setter 102E, and transmits the measured operation data to the user terminal 10. Thus, the third collector 103C collects the measured operation data. The flow of measurement of the operation data on the robot by the robot controller 21 is as described above.

[Requester]

The requester 104 is implemented mainly by the controller 11. As described above, the collection condition includes the measurement schedule for the operation data in this embodiment. The robot controller 21 may determine whether or not a time period in which the operation data is collected has arrived, but this determination is made by the user terminal 10 in this embodiment.

The requester 104 is configured to determine whether or not the time period in which the operation data is collected has arrived based on the measurement schedule, and request the operation data from the robot controller 21 when the time period is determined to have arrived. For example, the requester 104 uses a real time clock or the like to acquire the current date and time, and determines whether or not a start time point of the time period in which the operation data is collected has arrived. In this embodiment, the integrated collection condition obtained by integrating the collection conditions is used, and thus the requester 104 determines whether or not the start time point of the time period indicated by the integrated collection condition has arrived.

Figure 8:
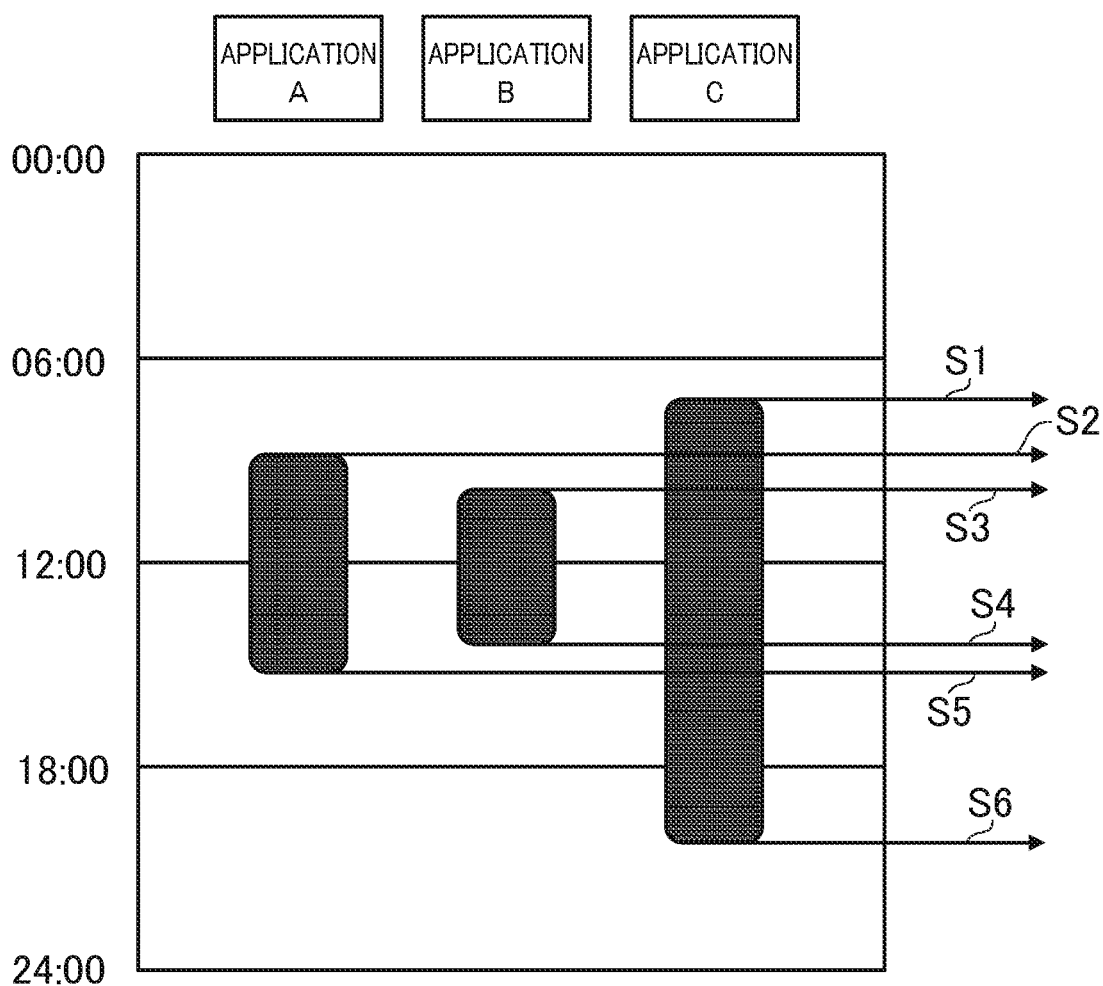
FIG. 8 is a diagram for illustrating how operation data is requested.

FIG. 8 is a diagram for illustrating how operation data is requested. In an example illustrated in FIG. 8, it is assumed that there are three applications AP of "application A" to "application C", and collection periods different from one another are set as collection conditions to the respective applications AP. In FIG. 8, the collection period of each application is indicated by a shaded strip. The requester 104 determines whether or not the time period in which the operation data used by each of the applications AP is collected has arrived based on the measurement schedules set to those three applications AP.

In the example of FIG. 8, the collection period for "application C" arrives first. When the collection period for "application C" arrives, the requester 104 transmits the collection condition for "application C" to the robot controller 21 (a state S1 of FIG. 8). A flag indicating that the operation data is being collected may be prepared, and this flag may be set to on at a timing of S1. The robot controller 21 starts measurement of the operation data based on the collection condition for "application C", and transmits the operation data to the user terminal 10.

Then, the collection period for "application A" arrives, and thus the requester 104 transmits the integrated collection condition for "application A" and "application C" to the robot controller 21 (a state S2 of FIG. 8). The robot controller 21 starts measurement of the operation data based on the integrated collection condition for "application A" and "application C", and transmits the operation data to the user terminal 10.

Lastly, the collection period for "application B" arrives, and thus the requester 104 transmits the integrated collection condition for "application A", "application B", and "application C" to the robot controller 21 (a state S3 of FIG. 8). The robot controller 21 starts measurement of the operation data based on the integrated collection condition for "application A", "application B", and "application C", and transmits the operation data to the user terminal 10.

When any one of the collection periods for the applications AP is finished, the collection condition changes, and the requester 104 notifies the robot controller 21 of the change. In the example of FIG. 8, the collection period for "application B" is finished first, and thus the requester 104 transmits an integrated collection condition for "application A" and "application C" to the robot controller 21 when the collection period for "application B" is finished, to thereby notify the robot controller 21 of the change in collection condition (a state S4 of FIG. 8). The robot controller 21 starts measurement of the operation data based on the integrated collection condition for "application A" and "application C", and transmits the operation data to the user terminal 10.

Next, the collection period for "application A" is finished, and thus the requester 104 transmits a collection condition for "application C" to the robot controller 21 when the collection period for "application A" is finished, to thereby notify the robot controller 21 of the change in collection condition (a state 85 of FIG. 8). The robot controller 21 starts measurement of the operation data based on the collection condition for "application C", and transmits the operation data to the user terminal 10.

Finally, the collection period for "application C" is finished, and the requester 104 requests stop of collection for the operation data when the collection period for "application C" is finished (a state S6 of FIG. 6). When stop of collection for "application C" is requested, the robot controller 21 stops measurement of the operation data. It is not required to measure the operation data after that, and this state may be notified to the robot controller 21. In this state, the flag indicating that the operation data is being collected may be set to off.

[Display Controller]

The display controller 105 is mainly implemented by the controller 11. The display controller 105 causes the display to display a setting screen for setting the collection condition based on the configuration information. The setting screen is a screen used to set the collection condition for the operation data collected from the robot indicated by the configuration information. The configuration of the robot is indicated in the configuration information, and, for example, the display controller 105 causes the display to display the types of the robot indicated by the configuration condition so as to be selectable on the setting screen. Moreover, for example, the types of operation data that can be collected can be identified based on the type of a robot, and the display controller 105 causes the display to display the types of operation data that can be collected on the setting screen.

FIG. 9 is a diagram for illustrating an example of the setting screen. As illustrated in FIG. 9, an input form F1, an input form F2, and an input form F3 are displayed on the setting screen G. The input form F1 is used to input a stetting name for the collection condition. The input form F2 is used to input the sampling time. The input from F3 is used to input the collection period. The collection condition is set for each application. Therefore, the user inputs, for example, an application name in the input form F1. Moreover, for example, the user selects a value indicating the sampling period from a pulldown menu of the input form F2. Moreover, for example, the user inputs any numerical value indicating the collection period in the input form F3.

Moreover, input forms F4, F5, F6, F7, F8, F9, F10, and the like are displayed on the setting screen G. The input form F4 is used to input the classification of the operation data.

The input form F5 is used to input the signal type, which is the type of operation data to be collected. The input form F6 is used to input the column name of the operation data. The input form F7 is used to input the group of robots for which the operation data is collected. The input form F8 is used to input the axis of the robot for which the operation data is collected. The input form F9 is used to input the unit of the operation data. The input form F10 is used to input the magnification of the operation data.

For example, values displayed on a pulldown menu of each of the input forms may be determined based on the configuration information on the robot controller 21. For example, the display controller 105 may set names displayed on the pulldown menu of the input form F8 based on the names of axes indicated by the configuration information. Moreover, for example, when the name of the group is contained in the configuration information, the display controller 105 may set names displayed on the pulldown menu of the input form F7 based on the group name indicated by the configuration information. The display controller 105 may similarly set names displayed on the pulldown menu of other input forms based on the configuration information.

[Storage]

The storage 106 is implemented mainly by the controller 11. The operation data collected from the robot controller 21 is stored in the operation database DB1. In this embodiment, the data structure of the operation database DB1 is set based on the configuration information, and the storage 106 stores the operation data in the operation database DB1 to which the data structure is set based on the configuration information. For example, information on a combination of the robot controller 21, the mechanism 22, and the device 23 from which the operation data is measured is added to the operation data, and the storage 106 stores the operation data in the operation database DB1 in association with this combination.

[3. Functions to be Executed by Operation Data Collection System]

A description is now given of processing to be executed by the operation data collection system 1. A description is given of collection condition setting processing and operation data collection processing. The collection condition setting processing sets the collection condition. The operation data collection processing collects the operation data based on the collection condition. Each of the collection condition setting processing and the operation data collection processing is executed by the CPU 11 operating in accordance with the program stored in the storage 12 in the user terminal 10, and by the CPU of the robot controller 21 operating in accordance with the program stored in the own storage. Each of the collection condition setting processing and the operation data collection processing is an example of the processing executed by the function blocks illustrated in FIG. 2.

[Collection Condition Setting Processing]

Figure 10:
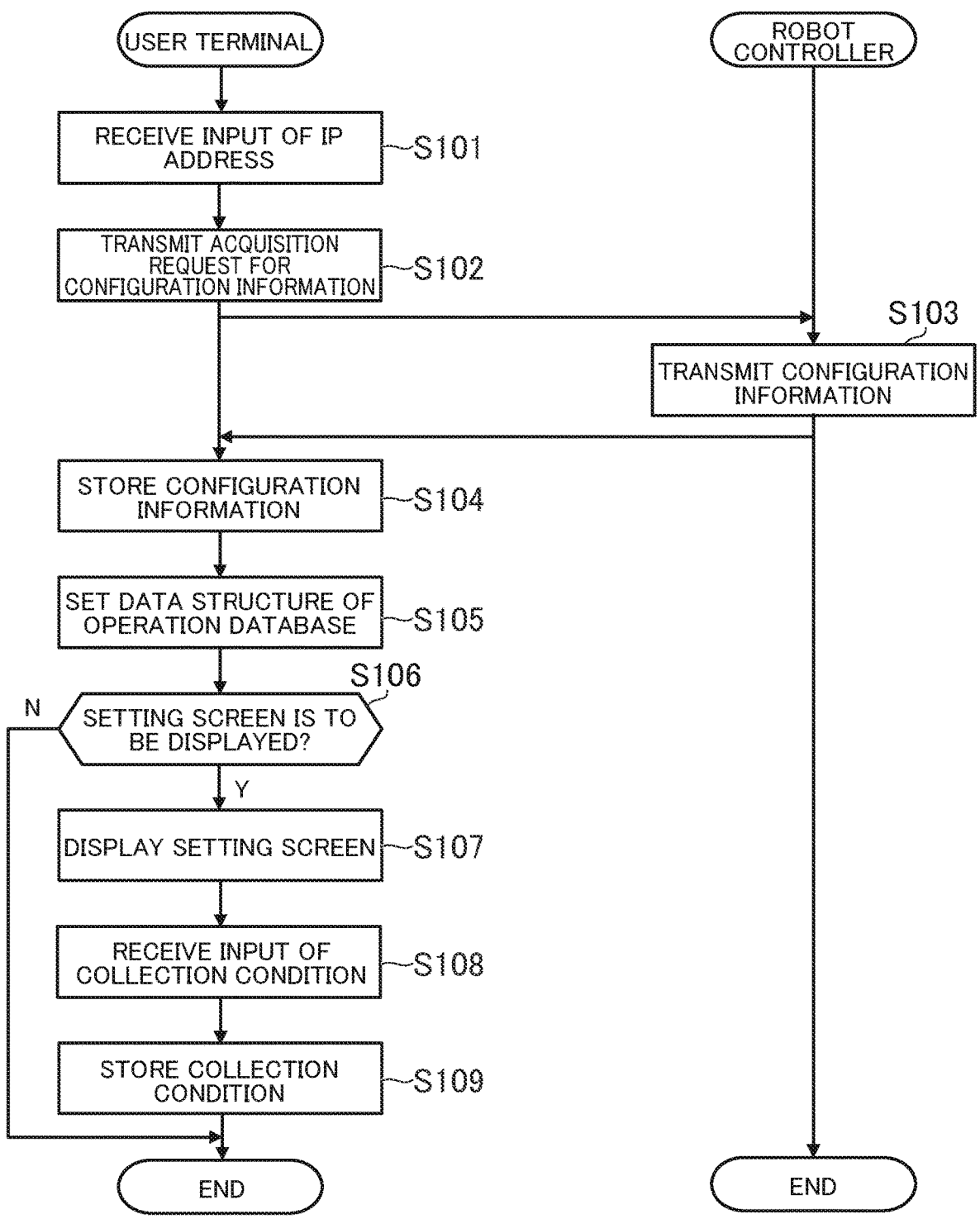
FIG. 10 is a flowchart for illustrating an example of collection condition setting processing.

FIG. 10 is a flowchart for illustrating an example of the collection condition setting processing. As illustrated in FIG. 10, first, the CPU 11 receives an input of the IP address of the robot controller 21 for which the configuration information is acquired (Step S101). The IP address may be input by the user through the operation interface 14, or may be input through reading of a file in which the IP address is described.

The CPU 11 transmits an acquisition request for the configuration information to the robot controller 21 based on the IP address input in Step S101 (Step S102). The acquisition request for the configuration information is only required to be made by transmitting a command in a predetermined format. For example, when the configuration information is stored in a register at a predetermined address in the robot controller 21, a reference request for this register is only required to be transmitted.

When the robot controller 21 receives the acquisition request for the configuration information, the robot controller 21 transmits the configuration information to the user terminal 10 (Step S103). In Step S103, the robot controller 21 reads the configuration information stored in the own storage, and transmits the configuration information to the user terminal 10.

When the configuration information is received in the user terminal 10, the CPU 11 stores the received configuration information in the configuration information database DB2 (Step 3104). In Step S104, the CPU 11 stores the received configuration information in association with the controller name of the robot controller 21 whose IP address is input in Step S101. The controller name may be input by the user through the operation interface 14, or may be input through reading of a file in which the controller name is described.

The CPU 11 sets the data structure of the operation database DB1 based on the received configuration information (Step S105). In Step S105, the CPU 11 sets the data structure of the operation database DB1 so that the operation data can be stored for each of the combinations of robots indicated by the configuration information.

The CPU 11 determines whether or not an operation of displaying the setting screen G is executed based on the detection signal of the operation interface 14 (Step S106). The setting screen G is only required to be displayed when a predetermined operation is executed. For example, when the setting screen G is displayed on a browser, the predetermined operation may be an input of a URL corresponding to the setting screen, or when the setting screen is displayed on an application, the predetermined operation may be a selection of a button for displaying the setting screen G.

When the operation is not executed (N in Step S106), this processing is finished. Meanwhile, when the operation is executed (Y in Step S106), the CPU 11 causes the display 15 to display the setting screen G based on the configuration information database DB2 (Step S107). When there are a plurality of robot controllers 21, the user may select the robot controller 21 when the setting screen G is displayed. In this case, in Step S107, the CPU 11 causes the display to display the setting screen G based on the configuration information on the robot controller 21 selected by the user.

The CPU 11 receives the input of the collection condition by the user based on the detection signal of the operation interface 14 (Step S108). In Step S108, the CPU 11 receives the input to each input form displayed on the setting screen G.

The CPU 11 stores the collection condition input by the user in the collection condition database DB3 (Step S109), and this processing is finished. In Step S109, the CPU 11 stores the collection condition input to each of the input forms F2 to F10 on the setting screen G in association with the name of the application input to the input form F1 by the user.

[Operation Data Collection Processing]

Figure 11:
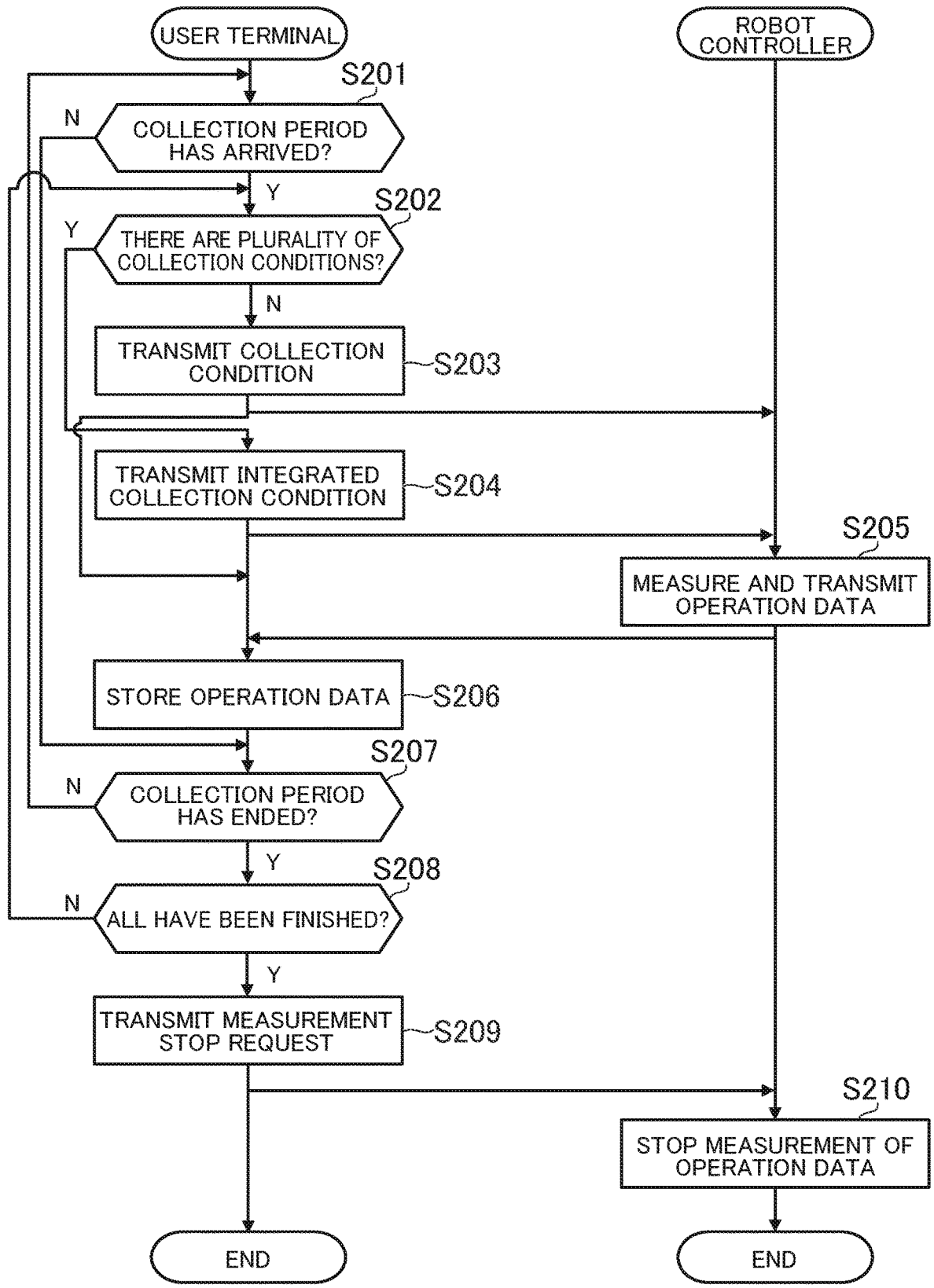
FIG. 11 is a flowchart for illustrating an example of operation data collection processing.

FIG. 11 is a flowchart for illustrating an example of the operation data collection processing. As illustrated in FIG. 11, the CPU 11 determines whether or not the collection period of any of the collection conditions has arrived based on the collection condition database DB3 (Step S201). In Step 3201, the CPU 11 uses a real time clock or the like to acquire the current date and time, to thereby determine whether or not the collection period indicated by each of the collection conditions has arrived.

When the collection period is not determined to have arrived (N in Step S201), the CPU 11 proceeds to processing in Step S207 described later. Meanwhile, when the collection period is determined to have arrived (Y in Step S201), the CPU 11 determines whether or not there are a plurality of collection conditions in the collection period (Step S202). In Step S202, the CPU 11 determines whether or not there are collection conditions in the collection period other than the collection condition whose collection period is determined to have arrived in Step S201. That is, in Step S202, the CPU 11 determines whether or not the plurality of collection conditions are required to be integrated.

When it is not determined that there are a plurality of collection conditions in the collection period (N in Step S202), the CPU 11 transmits the collection condition whose collection period has arrived to the robot controller 21 (Step S203). In this case, the collection condition in the collection period is only the collection condition whose collection period is determined to have arrived in Step S201, and thus the CPU 11 transmits the collection condition without integration.

Meanwhile, when it is determined that there are a plurality of collection conditions in the collection period (Y in Step S202), the CPU 11 transmits an integrated collection condition obtained by integrating the plurality of collection conditions to the robot controller 21 (Step S204). The CPU 11 generates the integrated collection condition by integrating the sampling times, the types of operation data, and the like indicated by the collection conditions in the collection period, and transmits the integrated collection condition to the robot controller 21.

When the robot controller 21 receives the collection condition or the integrated collection condition, the robot controller 21 measures the operation data, and transmits the measured operation data to the user terminal 10 (Step S205). In Step S205, the robot controller 21 measures the operation data on the robot based on the sampling time, the type of operation data, and the like indicated by the collection condition. After that, the robot controller 21 measures the operation data, and transmits the operation data to the user terminal 10 at each sampling time.

When the operation data is received in the user terminal 10, the CPU 11 stores the received operation data in the operation database DB1 (Step S206). In Step S206, the CPU 11 stores in the operation database DB1 the received operation data in association with the robot for which the operation data has been measured. The robot controller 21 measures the operation data appropriately, and the processing in Step S205 and the processing in Step 206 are repeated.

The CPU 11 determines whether or not the collection period has ended (Step S207). In Step S207, the CPU 11 uses a real time clock or the like to acquire the current date and time, to thereby determine whether or not the collection period has ended.

When the collection period is determined to have ended (Y in Step 3207), the CPU 11 determines whether or not all of the collection periods have ended based on the collection condition database DB3 (Step S208). In Step 3208, the CPU 11 determines whether or not a collection condition in the collection period is left.

When there is a collection period that has not ended (N in Step 3208), the CPU 11 returns to the processing in Step S202. In this case, a collection condition in the collection period is left, and thus the processing in Step S203 or Step S204 is executed after the determination in Step S202, and the collection condition is changed. The robot controller 21 measures the operation data based on the changed collection condition.

Meanwhile, when all of the collection periods are determined to have ended (Y in Step S208), the CPU 11 transmits a measurement stop request for the operation data to the robot controller 21 (Step S209). In this case, the operation data is not required to be measured, and thus the measurement stop request is transmitted. As the measurement stop request, information in a predetermined format is only required to be transmitted. When the robot controller 21 receives the measurement stop request, the robot controller 21 stops measurement of the operation data (Step S210), and this processing is finished.

With the operation data collection system 1, data collection corresponding to the configuration of a robot connected to the robot controller 21 can be executed through the setting for collecting the operation data on the robot based on the configuration information on the robot connected to the robot controller 21. For example, the collection condition corresponding to the configuration of the robot is set, and the database having the data structure corresponding to the configuration of the robot is built so that the operation data can be stored. Through execution of the data collection corresponding to the configuration of the robot, it is possible to increase precision of operation analysis for the robot and collection efficiency, and to compress a data amount by building a database having an efficient data structure. Moreover, a network load can be reduced by preventing unrequired operation data from being transmitted and reducing a communication amount.

Moreover, the precision and the collection efficiency of the operation data to be collected can be increased by collecting the operation data under the collection condition corresponding to the configuration information on the robot. Therefore, the precision of the analysis of the operation of the robot can be increased. Moreover, the network load can be reduced by preventing unrequired operation data from being transmitted and reducing the communication amount.

Moreover, when a plurality of collection conditions are specified, the plurality of collection conditions are integrated, and the collection efficiency of the operation data can be increased. Moreover, the network load can also be reduced by preventing operation data having redundant pieces of content from being transmitted and reducing the communication amount.

Moreover, the operation data of the same type can be prevented from redundantly being collected, and the operation data can be prevented from being collected on the same schedule by setting an integrated collection condition when at least one of the type of the operation data to be collected or the measurement schedule for the operation data is redundant among the plurality of collection conditions.

Moreover, a collection condition is set to each application, and a collection condition corresponding to the application can beset. Thus, it is possible to collect the operation data matching the object of the application.

Moreover, an operation load on the robot controller 21 can be reduced by managing the measurement schedule by the user terminal 10.

Moreover, the collection condition is easily set by setting the collection condition on the setting screen G corresponding to the configuration information.

Moreover, storage efficiency of the operation data can be increased by setting the data structure of the database corresponding to the configuration information, and storing the operation data. Useless data is not stored in the database, and thus the data amount can be reduced.

Moreover, even when a plurality of robot controllers 21 are connected, operation data corresponding to each robot controller 21 can be collected by executing the setting for collecting the operation data for the robot controller 21.

Moreover, when a plurality of robots are hierarchically connected to the robot controller 21, data collection can be executed in accordance with the hierarchical structure of the robots.

Moreover, when a master/slave relationship exists in a plurality of robots connected to the robot controller 21, data collection can be executed in accordance with the master/slave relationship.

4. Modification Examples

The present invention is not limited to the embodiment described above, and can be modified suitably without departing from the spirit of the present invention.

Figure 12:
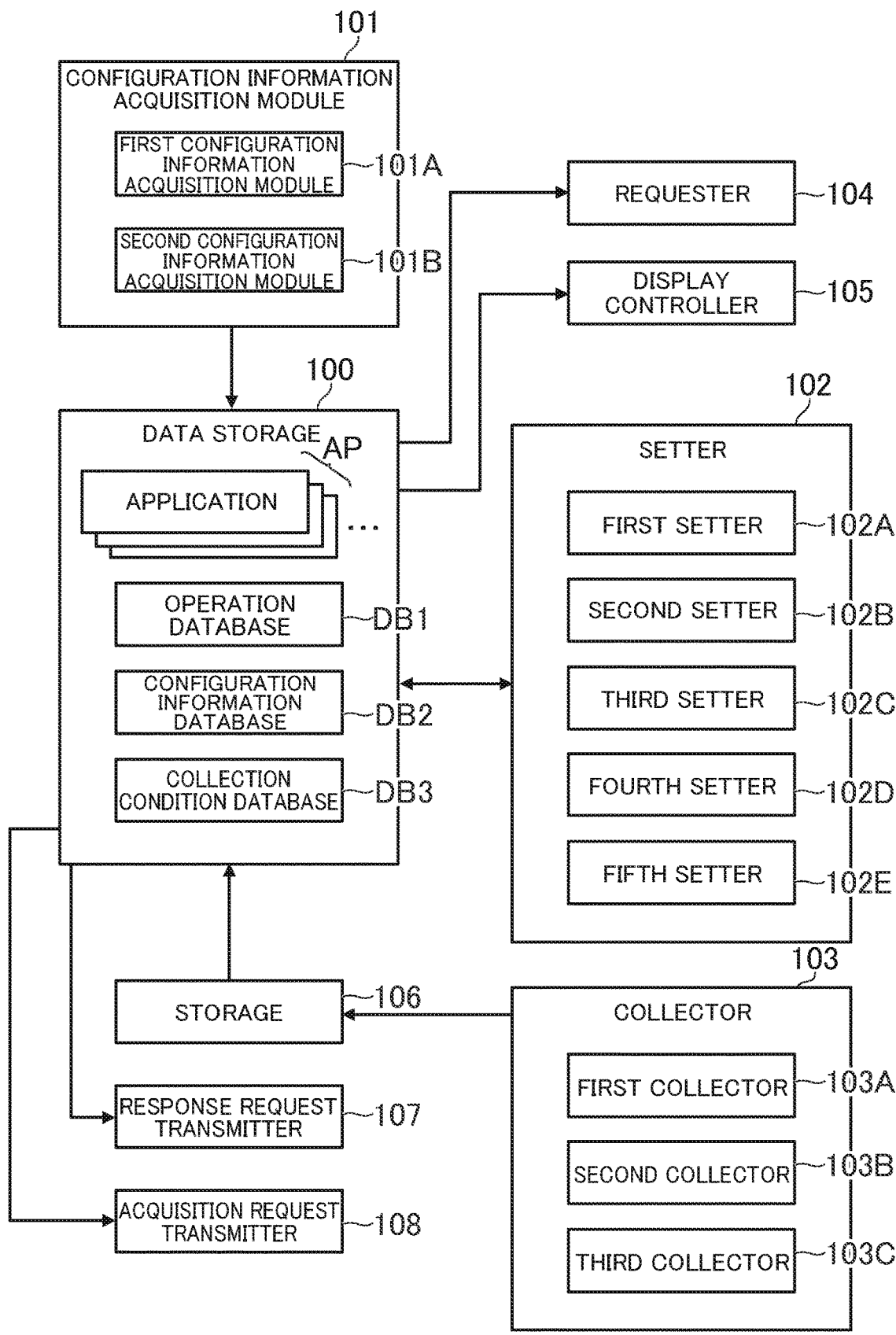
FIG. 12 is a functional block diagram in a modification example of the present invention.

FIG. 12 is a functional block diagram of a modification example of the present invention. As illustrated in FIG. 12, a response request transmitter 107, an acquisition request transmitter 108, and a second configuration information acquisition module 101B are implemented in the modification example described below. Those modules are implemented mainly by the CPU 11. For example, in the embodiment, a description is given of the case in which the user inputs the IP address of the robot controller 21, but the user may not input the IP address, and the user terminal 10 may acquire the IP address of the robot controller 21.

The response request transmitter 107 is configured to transmit a response request to all the nodes in the network N. For example, the response request transmitter 107 executes a broadcast ping command, to thereby transmit a response request to all the nodes in the network N. The response request is a request for returning an IP address to a computer that has received the response request. In this modification example, when the robot controller 21 receives the response request, the robot controller 21 transmits the own IP address and predetermined information indicating the robot controller. The predetermined information is only required to be information in a format determined in advance, and includes, for example, a predetermined symbol sequence.

The acquisition request transmitter 108 is configured to identify a node, which has returned a predetermined response to the response request, as the robot controller 21 among the nodes in the network N, and transmit an acquisition request for the configuration information to the identified node. The acquisition request transmitter 108 determines whether or not information in the predetermined format is received, and transmits an acquisition request for the configuration information to the node that has transmitted the information in the predetermined format. The acquisition request for the configuration information is as described in the embodiment. It is assumed that the IP address of the node (robot controller 21), which has returned the predetermined response, is held in the data storage 100.

The second configuration information acquisition module 101 acquires the configuration information transmitted in response to the acquisition request. The processing by the robot controller 21 of transmitting the configuration information in response to the acquisition request is as described in the embodiment. The second configuration acquisition module 101 acquires the configuration information transmitted by the robot controller 21, which has returned the predetermined response.

With the modification example described above, for example, it is possible to save labor of the user to input the IP address and labor of the user to acquire the configuration information from the identified robot controller 21 by identifying the robot controller 21 based on the response to the response request transmitted to all the nodes in the network N, and acquiring the configuration information from the identified robot controller 21.

A description has been given of the case in which the user terminal 10, which executes the application AP, collects the operation data by itself, but another computer may collect the operation data. That is, the computer that executes the application program AP and the computer that collects the operation data may be the same or different. Moreover, for example, the computer that executes the application AP may be a server computer. Moreover, for example, the computer that collects the operation data may be a server computer. Moreover, for example, a description has been given of the case in which each function is implemented in the user terminal 10, but the respective functions may be implemented by a plurality of computers in a distributed manner. For example, the functions may be implemented by the user terminal 10 and the robot controller 21 in a distributed manner. Moreover, for example, a description has been given of the case in which an example of circuitry is the CPU 11 of the user terminal 10, but circuitry may be a CPU of another computer which includes same structures as the user terminal 10.

Further, the embodiment described above is given as a specific example, and is not to limit the invention disclosed herein to the very configuration and data storage examples of the specific example. A person skilled in the art may make various modifications to the disclosed embodiment with regard to, for example, the shapes and numbers of physical components, data structures, and execution orders of processing. It is to be understood that the technical scope of the invention disclosed herein encompasses such modifications. In other words, it should be understood by those skilled in the art that various modifications, combinations, sub-combinations and alterations may occur depending on design requirements and other factors insofar as they are within the scope of the appended claims or equivalents thereof.

The invention claimed is:

1. An operation data collection system, comprising circuitry configured to:
   acquire, from an industrial device, configuration information on a connection destination device connected to the industrial device;
   execute a setting for collecting operation data on the connection destination device based on the configuration information;
   set a collection condition for the operation data based on the configuration information;
   collect the operation data from the industrial device based on the collection condition;
   set, when a plurality of collection conditions are specified, an integrated collection condition obtained by integrating the plurality of collection conditions; and
   wherein the collection condition contains at least one of a type of the operation data to be collected, or a measurement schedule for the operation data, and
   wherein the circuitry is configured to set the integrated collection condition when at least one of the type of the operation data or the measurement schedule for the operation data is redundant;
   collect the operation data from the industrial device based on the integrated collection condition;
   wherein the integrated collection condition excludes the redundant operation data or measurement schedule for the operation.

2. The operation data collection system according to claim 1, further comprising a storage configured to store a plurality of applications for collecting the operation data,
   wherein the collection condition is set for each of the plurality of applications.

3. The operation data collection system according to claim 2,
   wherein the collection condition contains a measurement schedule for the operation data, and
   wherein the circuitry is configured to determine whether or not a time period in which the operation data is collected has arrived based on the measurement schedule, and request the industrial device for the operation data when the time period is determined to have arrived.

4. The operation data collection system according to claim 1, wherein the collection condition contains a measurement schedule for the operation data, and
   wherein the circuitry is configured to determine whether or not a time period in which the operation data is collected has arrived based on the measurement schedule, and request the industrial device for the operation data when the time period is determined to have arrived.

5. The operation data collection system according to claim 1, wherein the circuitry is configured to display, on a display, a setting screen for setting the collection condition based on the configuration information.

6. The operation data collection system according to claim 1, wherein the circuitry is configured to set a data structure of a database configured to store the operation data based on the configuration information; and
   the operation data collection system further comprises a storage configured to store the operation data collected from the industrial device in the database.

7. The operation data collection system according to claim 1, wherein the circuitry is configured to:
   acquire the configuration information from each of a plurality of industrial devices;
   execute the setting for each of the plurality of industrial devices; and
   collect the operation data from each of the plurality of industrial devices based on the setting executed for the each of the industrial device.

8. The operation data collection system according to claim 1,
   wherein a plurality of connection destination devices are hierarchically connected to the industrial device; and
   wherein the hierarchical structure of the plurality of connection destination devices is indicated in the configuration information.

9. The operation data collection system according to claim 1,
   wherein a plurality of connection destination devices including a master device and a slave device controlled by the master device are connected to the industrial device; and
   wherein a master/slave relationship of the plurality of connection destination devices is indicated in the configuration information.

10. The operation data collection system according to claim 1, wherein the circuitry is configured to:
   transmit a response request to all nodes in a network;
   identify a node having returned a predetermined response to the response request, as the industrial device among all the nodes in the network, and transmit an acquisition request for the configuration information to the identified node; and
   acquire the configuration information transmitted in response to the acquisition request.

11. The operation data collection system according to claim 1, wherein:
   the connection destination device includes one or more motor,
   the industrial device is a controller relating a motor control, and
   the operation data indicates an action relating the one or more motor.

12. The operation data collection system according to claim 1, further comprising a storage configured to store a plurality of applications for collecting the operation data,
   wherein the collection condition is set for each of the plurality of applications.

13. The operation data collection system according to claim 1, further comprising a storage configured to store a plurality of applications for collecting the operation data,
   wherein the collection condition is set for each of the plurality of applications.

14. The operation data collection system according to claim 1,
   wherein the collection condition contains a measurement schedule for the operation data, and
   wherein the circuitry is configured to determine whether or not a time period in which the operation data is collected has arrived based on the measurement schedule, and request the industrial device for the operation data when the time period is determined to have arrived.

15. The operation data collection system according to claim 1,
   wherein the collection condition contains a measurement schedule for the operation data, and
   wherein the circuitry is configured to determine whether or not a time period in which the operation data is collected has arrived based on the measurement schedule, and request the industrial device for the operation data when the time period is determined to have arrived.

16. An operation data collection method, comprising:
   acquiring, from an industrial device, configuration information on a connection destination device connected to the industrial device;
   executing a setting for collecting operation data on the connection destination device based on the configuration information;
   setting a collection condition for the operation data based on the configuration information;
   collecting the operation data from the industrial device based on the collection condition;
   setting, when a plurality of collection conditions are specified, an integrated collection condition obtained by integrating the plurality of collection conditions; and
      wherein the collection condition contains at least one of a type of the operation data to be collected, or a measurement schedule for the operation data, and
      setting the integrated collection condition when at least one of the type of the operation data or the measurement schedule for the operation data is redundant;
   collecting the operation data from the industrial device based on the integrated collection condition;
   wherein the integrated collection condition excludes the redundant operation data or measurement schedule for the operation.

17. A non-transitory information storage medium storing a program for causing a computer to:
   acquire, from an industrial device, configuration information on a connection destination device connected to the industrial device;
   execute a setting for collecting operation data on the connection destination device based on the configuration information;
   set a collection condition for the operation data based on the configuration information;
   collect the operation data from the industrial device based on the collection condition;
   set, when a plurality of collection conditions are specified, an integrated collection condition obtained by integrating the plurality of collection conditions; and
      wherein the collection condition contains at least one of a type of the operation data to be collected, or a measurement schedule for the operation data, and
      set the integrated collection condition when at least one of the type of the operation data or the measurement schedule for the operation data is redundant;
   collect the operation data from the industrial device based on the integrated collection condition;
   wherein the integrated collection condition excludes the redundant operation data or measurement schedule for the operation.

\* \* \* \* \*